United States Patent [19]
Nagasaka et al.

[11] Patent Number: 5,973,408
[45] Date of Patent: Oct. 26, 1999

[54] ELECTRODE STRUCTURE FOR A SEMICONDUCTOR DEVICE

[75] Inventors: Hiroshi Nagasaka; Daiji Uehara; Kouichiro Sugisaki, all of Tokyo, Japan

[73] Assignee: Nagano Keiki Seisakusho, Ltd., Tokyo, Japan

[21] Appl. No.: 08/882,191

[22] Filed: Jun. 25, 1997

[30] Foreign Application Priority Data

Dec. 27, 1996 [JP] Japan .................................. 8-349976

[51] Int. Cl.⁶ .................................................. H01L 29/12
[52] U.S. Cl. ........................................ 257/915; 257/751
[58] Field of Search .................................. 257/915, 751

[56] References Cited

U.S. PATENT DOCUMENTS

| | | | |
|---|---|---|---|
| 4,782,380 | 11/1988 | Shankar et al. | 257/751 |
| 5,202,579 | 4/1993 | Fujii et al. | 257/915 |
| 5,242,860 | 9/1993 | Nulman et al. | 257/915 |
| 5,360,996 | 11/1994 | Nulman et al. | 257/767 |
| 5,475,267 | 12/1995 | Ishii et al. | 257/763 |
| 5,561,326 | 10/1996 | Ito et al. | 257/751 |
| 5,565,708 | 10/1996 | Ohsaki et al. | 257/764 |
| 5,589,712 | 12/1996 | Kawashima et al. | 257/750 |
| 5,641,985 | 6/1997 | Tamura et al. | 257/528 |
| 5,675,186 | 10/1997 | Shen et al. | 257/751 |

FOREIGN PATENT DOCUMENTS 4-350973  12/1992  Japan .

Primary Examiner—David B. Hardy
Attorney, Agent, or Firm—Flynn, Thiel, Boutell & Tanis, P.C.

[57] ABSTRACT

An electrode structure for a semiconductor device is formed on the semiconductor device, consisting of silicon formed on a substrate to detect a physical quantity of the substrate and converting it into an electric signal, and transfers the converted electric signal to the outside. The electrode structure for the semiconductor device has a barrier layer consisting of a high-melting metal nitride and formed on a contact area of the semiconductor device and an electrode wiring formed on the barrier layer. The barrier layer has different composition ratios of the high-melting metal nitride in correspondence to each stage in the thickness of the barrier layer, in which the composition ratios are a composition ratio making a powerful bond performance at a bonding border area with the electrode wiring, and a composition ratio in which a metal element of the electrode wiring does not diffuse into the semiconductor in the barrier layer.

3 Claims, 7 Drawing Sheets

ELECTRODE STRUCTURE FOR A SEMICONDUCTOR DEVICE

BACKGROUND OF THE INVENTION

1. Field of the Invention

This invention relates to an electrode structure for a semiconductor device, having a semiconductor device consisting of silicon formed on a substrate to detect any physical quantity of the substrate and to convert it into an electrical signal; and an electrode wiring formed on the semiconductor device to transfer the electric signal to the outside, and also to a method for producing the same, which is allowed to be used for example as a pressure sensor chip for pressure detection of a high-temperature vapor, pressure detection in a combustion engine system, detection of molding pressure in resin injection, and so on.

2. Background of the Invention

Conventionally, a sensor chip, which has a semiconductor device formed on a small silicon substrate or the like and converting a physical quantity of the substrate into an electrical signal, and electrode wiring formed on the semiconductor device and transferring the electrical signal to the outside, is used as a sensor used for a built-in control and so on. The small sensor as described above does not need a large space for attachment, so that multiple measuring points are located in case of necessity, resulting in a control system with the high-precision. For example, there is the pressure sensor for the existing built-in control shown in FIG. 8, which has a built-in pressure sensor chip therein.

A pressure sensor 1 is composed of a main body 2, a fluid introduction 3 connected to one end of the main body 2, and a lead wire accommodation 4 connected to the other end of the main body 2.

A pressure-sensor module 11 is accommodated in the main body 2. A fluid introducing port 5 is formed in the fluid introduction 3 to guide fluid which its pressure is measured. A lead wire 6, transferring an electric signal to a signal processing means provided at the outside (not shown in FIG. 8), is accommodated and secured in the lead wire accommodation 4.

The pressure-sensor module 11 is, in turn, composed of a pressure-sensor chip 21 detecting the pressure of the fluid and converting it into the electric signal, a support 12 supporting the pressure-sensor chip 21, a case 13 covering the pressure-sensor chip 21 to be adhered to the support 12, and a pedestal 14 provided between the pressure-sensor chip 21 and the support 12.

The support 12 has a hole 15 which connects the fluid introducing port 5 from the bottom of the hole 15 to a through-hole 16, formed in the pedestal 14, from the top of the hole 15. The fluid to be measured is guided through the fluid introducing port 5, the hole 5 of the support 12 and the through-hole 16 of the pedestal 14 to the pressure-sensor chip 21.

A repeating base 17 is provided to the case 13 to go through the inside to the outside of the case 13. An inner wiring 18 links the repeating base 17 to the pressure-sensor chip 21. And further, an I/O terminal 19 for connecting to the lead wire 6 is provided on the outside of the repeating base 17.

As shown in FIG. 9, the pressure-sensor chip 21 is, in turn, composed of a diaphragm 31 secured on the pedestal 14, a semiconductor device 41 and an electrode wiring 51, which are formed on the diaphragm 31.

The diaphragm 31 has a leg 32 jointed to the pedestal 14, and a substrate 33, which deforms in response to the pressure change of the measured fluid, to work as a pressure sensing device. The semiconductor device 41 is formed on the substrate 33 on an insulation film 34. A protective film 35, having an opening for connecting to the electrode wiring 51, covers the upper face of the semiconductor device 41. The electrode wiring 51 is formed on the protective film 35 to connect through the opening, formed on the protective film 35, to the semiconductor device 41.

As shown in a schematic view of FIG. 10, the four semiconductor devices 41 are formed on the substrate 33, which are mutually linked by means of the electrode wiring 51, thereby forming a bridged circuit 52 in which the four semiconductor devices 41 compose a distortion meter. And the inner wiring 18 is connected to an I/O terminal 53 provided at the end of the bridged circuit 52.

The aforementioned deformation of the substrate 33 is converted into the electric signal by the semiconductor device 41. The converted electric signal is transferred through the electrode wiring 51, the inner wiring 18, the repeating base 17, the I/O terminal 19 and the lead wire 6 to signal processing means placed outside.

The pressure-sensor 1 having the aforementioned structured can be used for detecting the pressure of the high-temperature vapor, the pressure in a combustion engine system, or the molding pressure of the resin injection. Under the high-temperature condition in the aforementioned cases, an SOI (Silicon On Insulator) type pressure-sensor chip, such as the aforementioned pressure-sensor chip 21 in which the insulation film 34 is formed between the substrate 33 and the semiconductor device 41, is used.

As shown in a fragmentary enlarged sectional view of FIG. 11, in an electrode structure 71 for the semiconductor device of the conventional SOI type pressure-sensor chip 21, a contact area 42 is formed by incorporating boron in a part of the silicon semiconductor device 41. The aluminium-made electrode wiring 51 is connected to the contact area 42.

In the pressure-sensor chip 21 having the above structure, when the temperature of the atmosphere of the pressure sensor 1 is raised up to the high-temperature atmosphere of more than 300° C., the aluminium of the electrode wiring 51 diffuses by reacting with the silicon of the semiconductor device 41, so that the resistance of the semiconductor device 41 is partially changed, thus making it difficult to obtain an accurate distortion resistance value under the high-temperature condition.

For this reason, as shown in FIG. 12, Japanese Patent Application Laid-open No. Hei4-350973 discloses an electrode structure 171 for the semiconductor device in which a barrier layer 61, formed of high-melting nitriding metal (titanium nitride), and a high-melting metal (titanium) layer 62 are provided between the contact area 42 and the electrode wiring 151 formed by using any one of gold (Au), platinum (Pt), and nickel (Ni).

According to the above electrode structure 171 for the semiconductor device, metal which forms the electrode wiring 151 does not diffuse into silicon of the semiconductor device 41 because of the barrier layer 61, so that the distortion resistance value of the semiconductor device 41 does not change under the high-temperature condition. Incidentally, the titanium layer 62 as the high-melting metal layer is provided in order to ensure an ohmic contact with the contact area 42.

However, in the electrode structure 171 for the semiconductor device, the electrode wiring 151 and the barrier layer 61 are bonded, but the touched faces may be peeled from each other because of the weak bonding force of the high-melting metal nitride (titanium nitride) and Au, Pt or Ni, thus making it difficult for the sensor chip to get stable performance for detecting a physical quantity such as distortion.

The object of the present invention is to provide an electrode structure for a semiconductor device and a method for producing the same, in which it is allowed that electrode wiring does not diffuse into silicon of the semiconductor device and a bonding force between a contact area of the semiconductor device and the electrode wiring is secure.

SUMMARY OF THE INVENTION

An electrode structure for a semiconductor device according to the present invention, which is formed on the semiconductor device, consisting of silicon formed on a substrate, detecting a physical quantity of the substrate and converting it into an electric signal, and transfers the electric signal to the outside, is characterized by including a barrier layer consisting of a high-melting metal nitride and formed on a contact area of the semiconductor; and an electrode wiring formed on the barrier layer, the barrier layer having a composition ratio of the high-melting metal nitride in correspondence to each stage in the thickness of the barrier layer.

In this point, the high-melting metal nitride has an excellent heat-resistant property like titanium nitride, and a barrier performance which allows to prevent a metal element of the electrode wiring from diffusing into the silicon semiconductor device.

According to the present invention described above, the composition ratios of the high-melting metal nitride forming the barrier layer differ in correspondence to the direction of the thickness, so that the barrier layer is allowed to have stageably or continuously different performances.

Therefore, it is allowed that the composition ratio of a part of the barrier layer is defined to attach importance to a barrier performance, and the composition ratio of the other parts is defined to attach importance to a bond performance with other members. Insofar as a sensor chip has the aforementioned barrier layer, the aforementioned disadvantages are solved, so that the stable performance is shown in a high-temperature state of more than 300° C.

In the above description, it is desirable that the barrier layer has therein a barrier performance which prevents the metal composing of the electrode wiring from diffusing into the semiconductor device; and the composition ratio of the high-melting metal nitride forming the barrier layer is defined to have a strong bonding with a matter bonded with the barrier layer, in at least any one of a bonding border area between the barrier layer and the electrode wiring, and a bonding border area between the barrier layer and the contact area.

In this point, "the composition ratio of the high-melting metal is defined to have a strong bonding" means the composition ratio of the high-melting metal nitride, having the bonding force not to produce the peeling between the barrier layer and the electrode wiring and also between the barrier layer and the contact area of the semiconductor device, when tests for the layers are carried out by using a peeling method and a pulling method which are used for measuring the bonding force between the film and the substrate.

More specifically, for example, where the high-melting metal nitride is a titanium nitride, the proportion of titanium element for the titanium nitride is more than 60% and the composition ratio being as close as possible to pure metal titanium.

The high-melting metal nitride in the barrier layer is preferably the composition ratio which the barrier performance is not inferior. For example, where the proportion of titanium element for the aforementioned titanium nitride is less than 60%, the barrier performance is retained.

Insofar as the barrier layer has the aforementioned composition ratio of the high-melting metal nitride, the peeling between layers in the bonding border area does not occur, and the barrier performance is not inferior, thus further stabilizing the performance of the sensor chip.

Incidentally, in the aforementioned electrode structure for the semiconductor device, the bond performance between the contact area and the barrier layer is weaker than the bond performance between the electrode wiring and the barrier layer. Mainly, insofar as the bonding between the electrode wiring and the barrier layer is secure, the object of the present invention is attained.

As to the barrier layer, it is advisable that the barrier layer has a multilayered structure with laminating films each having the different composition ratio of the high-melting metal nitride.

More specifically, the barrier layer has the multilayered structure, thereby the films of the high-melting metal nitride of the specified composition ratios are allowed to be stageably formed and each film is allowed to have character in response to the required property such as the barrier performance, the bond performance and so on.

And further, it is desirable that the high-melting metal nitride is nitride of the same metal.

More specifically, where the barrier layer is formed from the nitride of the same metal, it is not needed to consider as to the bond performance between the different type metal nitrides and to change the types of metal as a target when the film is formed by means of the sputtering, thus achieving the efficient processes for forming the barrier layer.

It is advisable that the aforementioned high-melting metal nitride is a titanium nitride. And it is advisable that the barrier layer has a first titanium nitride film located to connect to the electrode wiring and a second titanium nitride film located under the first titanium nitride film, in which the composition ratio of the first titanium nitride film has the proportion of the number of titanium atoms of 62% to 75% for the titanium nitride; and the composition ratio of the second titanium nitride film has the proportion of the number of titanium atoms of 50% to 59% for the titanium nitride.

The barrier layer is formed by laminating the first titanium nitride film and the second titanium nitride film which each have the aforementioned composition ratio, thereby allowing the high-performance electrode structure for the semiconductor device ensuring the bond performance with the electrode wiring and the barrier performance to be formed.

And further, it is advisable that the first titanium nitride film is 500 Å to 1,000 Å thick; and the second titanium nitride film is 3,000 Å to 4,000 Å thick.

More specifically, when the thickness of the first titanium nitride film is from 500 Å to 1,000 Å, the excellent bond performance is ensured for both the electrode wiring and the second titanium nitride film, and the strength of the first titanium nitride film itself is ensured. Thereby avoiding the peeling between the electrode wiring and the second titanium nitride film.

And as compared with the thickness ranging from 500 Å to 1,000 Å of the first titanium nitride film, the thickness ranging from 3,000 Å to 4,000 Å of the second titanium nitride film is sufficiently thicker, so that the barrier performance in the barrier layer is not inferior by forming the first titanium nitride film.

A method for producing an electrode structure for a semiconductor device according to the present invention is a method for producing the electrode structure for the semiconductor device, formed on the semiconductor device consisting of silicon and formed on a substrate to detect a physical quantity of the substrate and convert it into an electric signal and transfers the electric signal to the outside, in which the electrode structure for the semiconductor device has a barrier layer consisting of a high-melting metal nitride and formed on a contact area of the semiconductor device, and an electrode wiring formed on the barrier layer, the barrier layer being a multilayered structure with laminating films each having a different composition ratio of the high-melting metal nitride in correspondence to each stage in the thickness of the barrier layer, and the method is characterized by including the step of forming the barrier layer by means of reactive sputtering using a high-melting metal as a target in an atmosphere which a nitrogen gas is added into an inactive gas.

According to the present invention described above, in the reactive sputtering, a nitrogen gas is added into the atmosphere in sputtering apparatus and by changing the additional amount of nitrogen gas, various films of the high-melting metal nitride is allowed to be formed.

It is advisable that each film of the barrier layer is formed by stageably changing an additional amount of nitrogen gas as time passes.

More specifically, by stageably changing the additional amount of nitrogen gas, the additional amount of nitrogen gas does not need to be controlled all the time, thus simplifying the processes for forming the barrier layer.

In the aforementioned description, it is advisable that the nitrogen gas is added at the range of the ratio of flow 0% to 50% for the total amount of gas including the inactive gas.

That is to say, in the reactive sputtering, the composition ratio of the titanium nitride is a balanced state at almost 50% of the ratio of the nitrogen gas flow. Therefore, the ratio of the nitrogen gas flow for the total amount of gas is changed in the range of 0% to 50%, thereby allowing the titanium nitride film having the required composition ratio to be formed.

And further, it is advisable that the reactive sputtering is carried out by defining the temperature of the substrate, formed under the contact area formed under the barrier layer, as more than 300° C. when the barrier layer is formed.

When the temperature of the substrate is defined in the range of 300° C. to 550° C., the temperature of the contact area of the semiconductor formed on the substrate changes to a similar degree of the temperature to the substrate.

Therefore, when the temperature of the contact area is in the above range, the diffusion between layers does not occur and the bond performance between the contact area and the barrier layer is improved, thereby allowing the stability of the electrode structure for the semiconductor to be enhanced on a large scale.

DETAILED DESCRIPTION OF THE PREFERRED EMBODIMENT(S)

The preferred embodiment of the present invention will be explained below with reference to the attached drawings. Incidentally, the same numerals and symbols will be used to designate the same members or components as those mentioned above, so that the description will be omitted or simplified.

Figure 1:
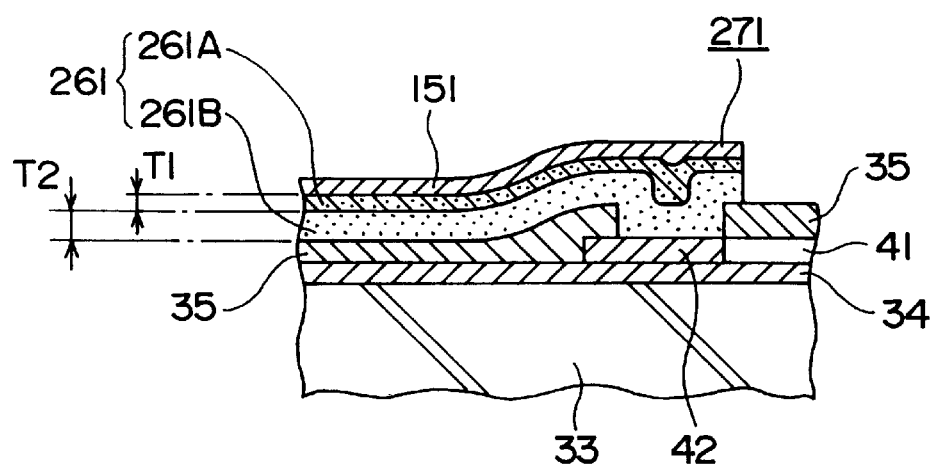
FIG. 1 is a fragmentary sectional view of an electrode structure for a semiconductor device according to the preferred embodiment of the present invention.
Figure 11:
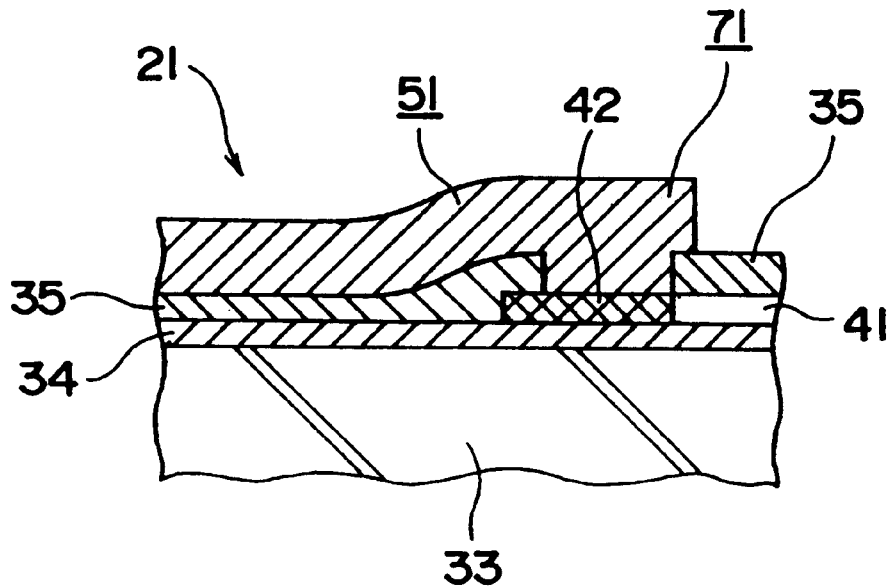
FIG. 11 is a fragmentary sectional view of the conventional electrode structure.
Figure 12:
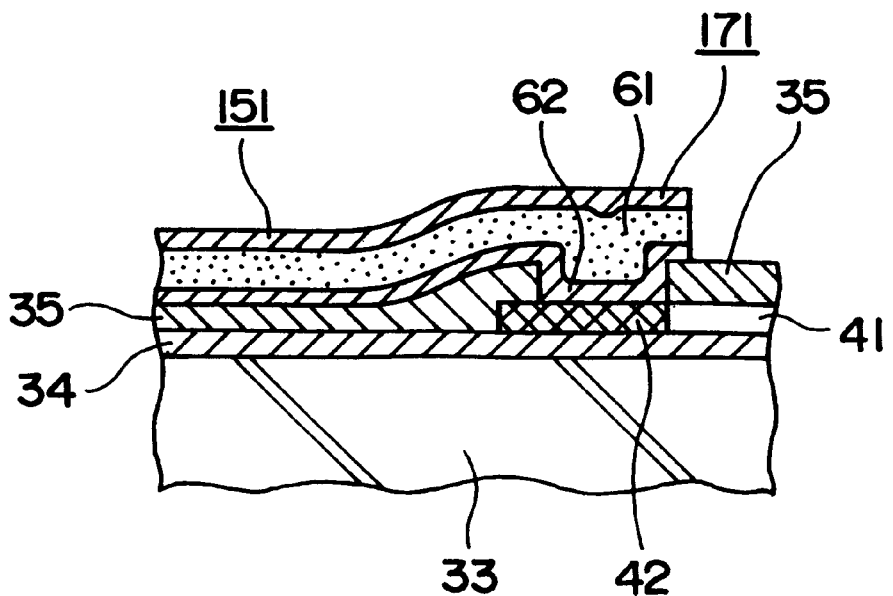
FIG. 12 is a fragmentary sectional view of the conventional electrode structure.

FIG. 1 shows a fragmentary enlarged view of an electrode structure for a semiconductor device according to the embodiment of the present invention, which corresponds to FIG. 11 and FIG. 12 used in Description of Related Art.

The electrode structure 271 for the semiconductor device is composed of a silicon semiconductor device 41 formed on a substrate 33, a barrier layer 261 formed from the titanium nitride as high-melting metal nitride and formed on a contact area 42 of the semiconductor device 41, and an electrode wiring 151 formed on the barrier layer 261.

The barrier layer 261 has a double-layer(ed) structure: a first titanium nitride film 261A located in the bonding border area with the electrode wiring 151, and a second titanium nitride film 261B located under the first titanium nitride film 261A and having the different composition ratio of titanium nitride from the first titanium nitride film 261A.

In order to enhance the bonding force with the electrode wiring 151 placed on the upper side of the first titanium nitride film 261A, the first titanium nitride film 261A has a composition in which the titanium is at a larger proportion, more specifically, the proportion of the number of titanium atoms to the titanium nitride ranges from 62% to 75%.

In order to prevent metal in the electrode wiring 151 from thermal-diffusing into the semiconductor device 41 in a high-temperature atmosphere over 300° C., the second titanium nitride film 261B has a composition in which the titanium is at a smaller proportion, more specifically, the proportion of the number of titanium atoms to the titanium nitride ranges from 50% to 59%.

Incidentally, the thickness T1 of the first titanium nitride film 261A is from 500 Å to 1,000 Å, and the thickness T2 of the second titanium nitride film 261B is from 3,000 Å to 4,000 Å, so that the thickness T1 is sufficiently thinner than the thickness T2.

It is possible for the electrode wiring 151 to be formed by using any one of gold (Au), platinum (Pt), and nickel (Ni) as described above. However, gold (Au) is preferred as a material for the electrode wiring 151 in view of the fact that gold is used as a material for an I/O signal wire connected to the electrode wiring 151.

The electrode structure 271 for the semiconductor device, as described thus far, is formed by means of magnetron sputtering.

After the opening is formed in order to connect the contact area 42 to the electrode wiring 151, the barrier layer 261 consisting of the titanium nitride of two types is formed by means of reactive sputtering.

In this point, in order to form the strong barrier layer 261, it is advisable that the temperature of the substrate 33 formed thereon with the semiconductor device 41 is defined at 300° C.

More specifically, with the use of a sputtering apparatus in which titanium is used as a target, initially, the sputtering is carried out by adding a nitrogen gas into an argon gas to make the composition ratio of the first titanium nitride film 261A.

After the required thickness of the first titanium nitride film 261A is obtained, the additional amount of nitrogen gas is conditioned to make the composition ratio of the second titanium nitride film 261B. And then, after -the required thickness of the second titanium nitride film 261B is obtained, the magnetron sputtering is carried out by using gold (Au) as a target in the pure argon-gas atmosphere to form the electrode wiring 151.

According to the embodiment described thus far, the following effects will be given.

The composition ratio of titanium nitride forming the barrier layer 261 differs between the first titanium nitride film 261A and the second titanium nitride film 261B, so that each of the titanium nitride films has the different performance from each other.

More specifically, the first titanium nitride film 261A has the bond performance with the electrode wiring 151. The second titanium nitride film 261B has the barrier performance. Thereby allowing the electrode structure 271 for the semiconductor device to be the electrode structure superior in the barrier performance and the bond performance. In consequence, insofar as the sensor chip includes the aforementioned electrode structure 271 for the semiconductor device having the barrier layer 261, the stable performance is allowed to be given even in the high-temperature atmosphere of 300° C.

From the fact the barrier layer 261 is formed from the nitride of the same metal used for the first titanium nitride film 261A and the second titanium nitride film 261B, when the barrier layer is formed by means of the reactive sputtering, the barrier layer having the aforementioned properties is allowed to be formed by conditioning the additional amount of nitrogen gas in the argon gas only once. Thus streamlining and simplifying processes for forming the barrier layer.

Further, the reactive sputtering is carried out by defining the temperature of the substrate 33 at 300° C. to 550° C., so that the bonding between the contact area 42 and the barrier layer 261 are ensured without the diffusion between layers, thus forming the strong electrode structure for the semiconductor device.

EXPERIMENT

Each composition ratio of the first titanium nitride film 261A and the second titanium nitride film 261B is specifically decided as follows.

In the reactive sputtering, the relationship between the composition ratio of the titanium nitride film formed and the additional amount of nitrogen gas is found with quantitative analysis by means of Auger electron spectroscope.

Figure 2:
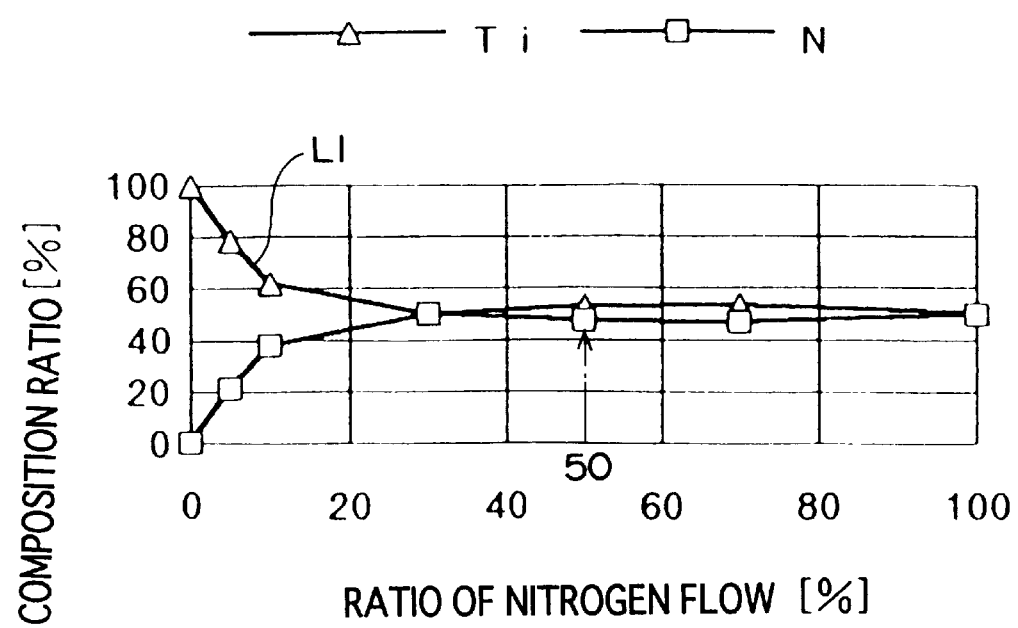
FIG. 2 is a correlation graph depicting a relationship between the composition ratio of titanium nitride forming a barrier layer and the ratio of the nitrogen flow in reactive sputtering in the aforementioned embodiment.

As a result, as shown in FIG. 2, as the ratio of the nitrogen flow in the sputtering apparatus increases, in other words, as the proportion of nitrogen gas to the total amount of gas in the apparatus increases, the proportion of the number of titanium atoms to the titanium nitride decreases as illustrated in a graph line L1. And it is read that the ratio of the nitrogen flow is in the balanced state at approximate 50%.

EVALUATION OF THE BARRIER PERFORMANCE

On the semiconductor device 41 formed on the substrate 33, by using seven types of the titanium nitride of which the proportion of the number of titanium atoms is 79%, 75%, 62%, 59%, 56%, 53%, and 50%, seven types of the second titanium nitride films 261B of FIG. 1 (the thickness of 3,000 Å to 4,000 Å) are formed.

The substrate 33 is heated at 300° C.

On each of the seven second titanium nitride films 261B, the electrode wiring 151 composed of gold (Au) is formed. And they are exposed in each of the high-temperature atmospheres of 450° C., 500° C. and 550° C. for an hour. And then each barrier performance of the titanium nitride films is verified. Table 1 shows the result.

Incidentally, the verification of the barrier performance in Table 1 is given in reference to the following evaluation.

◎ The barrier performance is excellent and the diffusion into the semiconductor device does not occur.

Δ The diffusion partially occurs and the semiconductor device is partially alloyed.

X The barrier performance under the condition of the aforementioned temperature is not seen, and the whole of semiconductor device is alloyed.

TABLE 1

| Ratio of nitrogen flow (%) | Ratio of Ti (%) | Barrier performance (exposing in each temperature for an hour) | | |
| --- | --- | --- | --- | --- |
| | | 450° C. | 500° C. | 550° C. |
| 5 | 79 | X | X | X |
| 6 | 75 | ◎ | Δ | Δ |
| 10 | 62 | ◎ | ◎ | Δ |
| 15 | 59 | ◎ | ◎ | ◎ |
| 20 | 56 | ◎ | ◎ | ◎ |
| 30 | 53 | ◎ | ◎ | ◎ |
| 50 | 50 | ◎ | ◎ | ◎ |

From Table 1, it is understood that the barrier performance is allowed to be sufficiently maintained when the titanium nitride in which the proportion of the number of titanium atoms is 50% to 59% is used for the aforementioned second titanium nitride film 261B.

EVALUATION OF THE BOND PERFORMANCE

When the titanium nitride of the proportion 50% of the number of titanium atoms is the second titanium nitride film 261B (the thickness of 4,000 Å), on this second titanium nitride film 261B, the seven types of first titanium nitride films 261A, shown in FIG. 1, (the thickness of from 500 Å to 1,000 Å) are formed by using the seven types of titanium nitride in which the proportion of the number of titanium atoms is each defined at 79%, 75%, 62%, 59%, 56%, 53%, and 50%.

In the same way as the evaluation of the barrier performance, evaluation is carried out as to each bond performance of the electrode structures 271 for the semiconductor devices, in which the electrode wiring 151 (Au) is formed on the aforementioned first titanium nitride film 261A.

Figure 3:
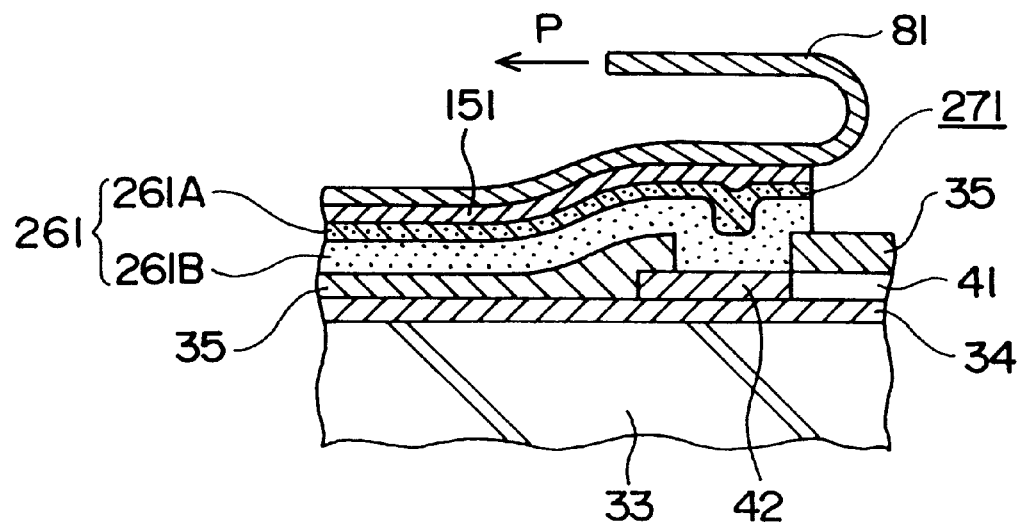
FIG. 3 is a sectional view explaining a test method of a peeling method for testing the bond performance of the barrier layer in the aforementioned embodiment.

The boding property is evaluated by two tests: a peeling method and a pulling method. As shown in FIG. 3, in the peeling method, a tape 81 of 20 mm wide is adhered on the electrode structure 271 in which the barrier layer 261 and the electrode wiring 151 are laminated on the semiconductor device 41. And, after the tape is peeled in the direction P, the peeled state of the electrode structure 271 for the semiconductor device is verified.

Figure 4:
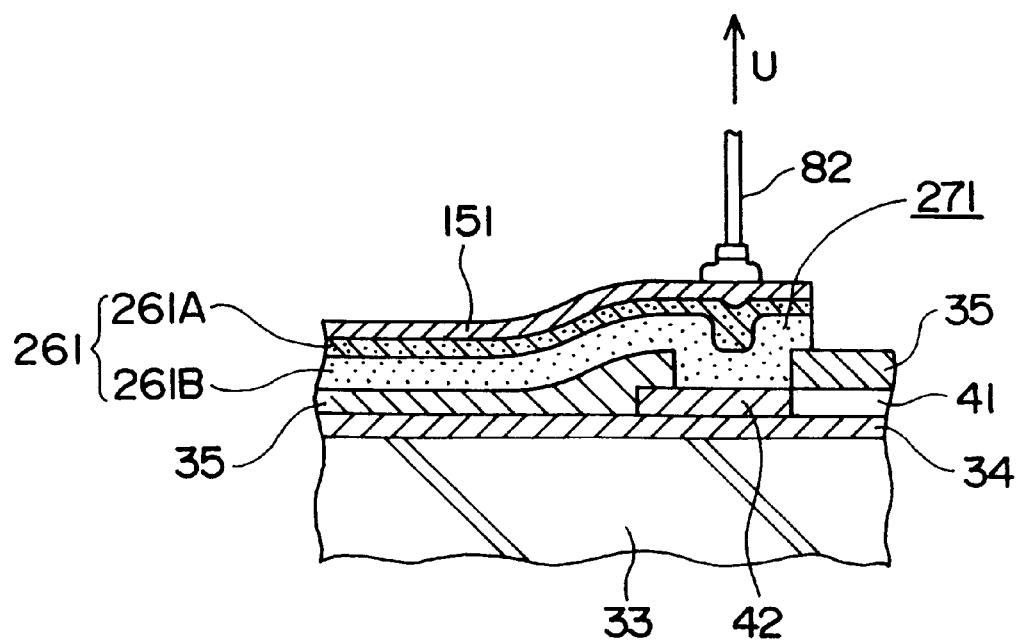
FIG. 4 is a sectional view explaining a test method of a pulling method for testing the bond performance of the barrier layer in the aforementioned embodiment.

In the pulling method, as shown in FIG. 4, a metal thin-wire (an Au wire Ø0.05 mm) 82 is ball-bonded on the surface of the electrode wiring 151 of the electrode structure 271 in which the barrier layer 261 and the electrode wiring 151 are laminated on the semiconductor device 41. And, after the metal thin-wire 82 is pulled in the direction U, the pulled state of the electrode structure 271 for the semiconductor device is verified.

In addition to the bond performance, by exposing the aforementioned electrode structure 271 for the semiconductor device in the high-temperature atmosphere of each of 450° C., 500° C. and 550° C. for an hour, the alloying state of the first titanium nitride film 261A and the electrode wiring 151 is verified.

The reason why the test for alloying is added is that; the alloying of the electrode wiring 151 causes the change in resistance value of the electrode wiring, and a metal thin-wire for interconnecting to the outside by connecting to the electrode wiring 151 to be peeled, thereby the appropriate electric signal is not allowed to be transferred to the signal processing means provided at the outside.

The results of the aforementioned three tests are shown in Table 2.

Incidentally, the verification of the bond performance in Table 2 is given in reference to the following evaluation.

⊙ The bond performance is excellent and the electrode wiring is not peeled.

Δ Approximately 10% of the electrode wiring is peeled.

X The electrode wiring is peeled, so that the bond performance is not excellent.

The verification of the alloying state in Table 2 is given in reference to the following evaluation.

⊙ The alloying does not occur, so that the electrode wiring is in good condition.

○ The alloying occurs in a minute percentage, but the electrode wiring is in fairly good condition.

Δ The alloying occurs partially.

X The alloying occurs variously throughout, so that the electrode wiring is not in good condition.

TABLE 2

| Ratio of nitrogen flow (%) | Ratio of Ti (%) | Bonding force | | Alloying state (exposing in each temperature for an hour) | | |
|---|---|---|---|---|---|---|
| | | Peeling M. | Pulling M. | 450° C. | 500° C. | 550° C. |
| 5 | 79 | ⊙ | ⊙ | X | X | X |
| 6 | 75 | ⊙ | ⊙ | ⊙ | ○ | Δ |
| 10 | 62 | ⊙ | ⊙ | ⊙ | ⊙ | Δ |
| 15 | 59 | Δ | X | ⊙ | ⊙ | ⊙ |
| 20 | 56 | X | X | ⊙ | ⊙ | ⊙ |
| 30 | 53 | X | X | ⊙ | ⊙ | ⊙ |
| 50 | 50 | X | X | ⊙ | ⊙ | ⊙ |

Peeling M. is the peeling method.
Pulling M. is the pulling method.

From Table 2, it is read that the bond performance of the first titanium nitride film 261A for the electrode wiring 151 is excellent and the electrode wiring is hardly alloyed, when the titanium nitride having the proportion of the number of titanium atoms of 62% to 75% is used for the first titanium nitride film 261A.

Based on the aforementioned results of tests, the electrode structure 271 for the semiconductor is formed by defining the proportion of the number of titanium atoms as 70% for the first titanium nitride film 261A, and defining the proportion of the number of titanium atoms as 50% for the second titanium nitride film 261B.

And, the electrode structure 271 is exposed in the high-temperature atmosphere of 300° C. for a long time. Then, the change ratio of the resistance value between the contact area 42 of the semiconductor device 41 and the second titanium nitride film 261B and the change ratio of the resistance value between the electrode wiring 151 and the first titanium nitride film 261A are measured.

Figure 5:
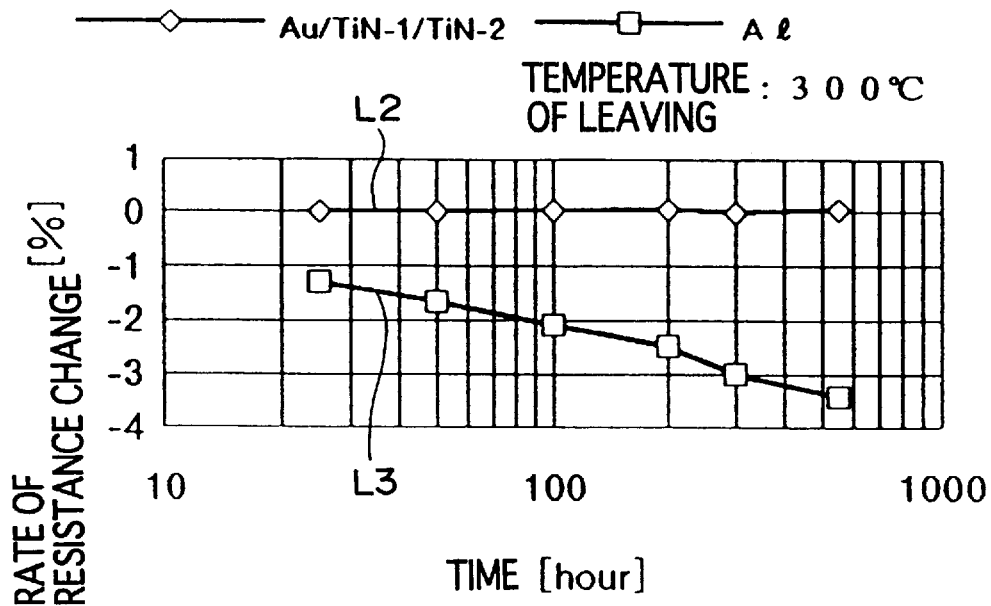
FIG. 5 is a relative graph depicting a relationship between an atmospheric exposure time in a high-temperature atmosphere and the resistance changing rate of the barrier layer and a contact area in the aforementioned embodiment.

As a result, as illustrated in a graph line L2 in FIG. 5, the change ratio of the resistance value between the contact area 42 and the second titanium nitride film 261A is fairly stable although the electrode structure 271 is exposed in the high-temperature atmosphere of 300° C. for more than 500 hours, thus verifying the excellent barrier performance of the second titanium nitride film 261B.

A graph line L3 in FIG. 5 shows the measured ratio of the resistance change of the electrode structure 71 for the semiconductor device shown in FIG. 11 used in Description of The Related Art, in which the large change of the resistance value is read.

Figure 6:
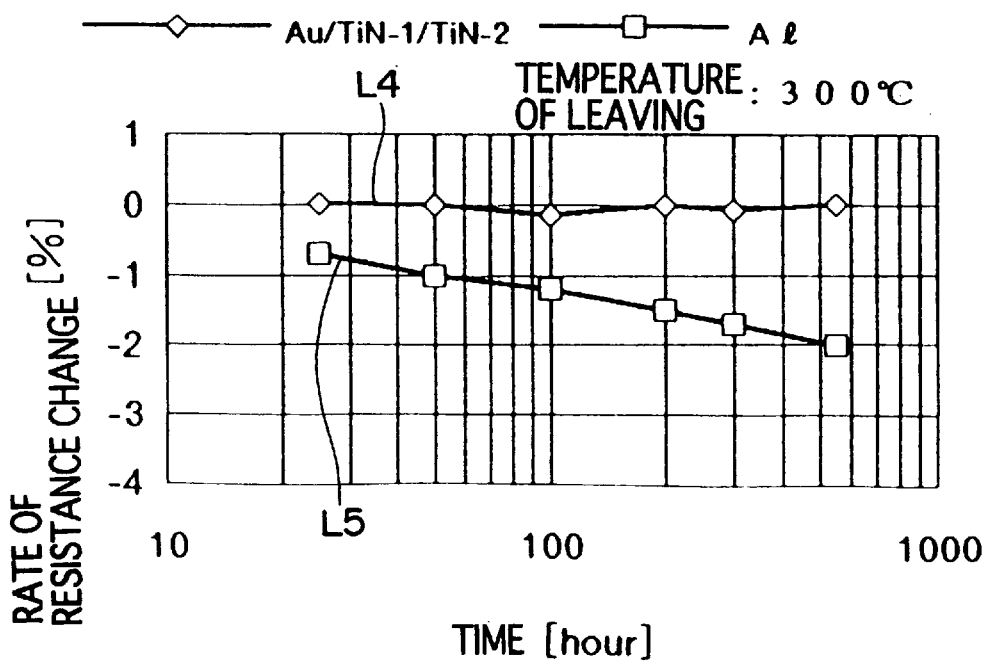
FIG. 6 is a relative graph depicting a relationship between an atmospheric exposure time in a high-temperature atmosphere and the resistance changing rate between the barrier layer and the electrode wiring in the aforementioned embodiment.

As illustrated in a graph line L4 in FIG. 6, the change ratio of the resistance value between the electrode wiring 151 and the first titanium nitride film 261A is also fairly stable although the electrode structure 271 is left in the high-temperature atmosphere of 300° C. for more than 500 hours, thus verifying that the first titanium nitride film 261A has the excellent bond performance with the electrode wiring 151, and that the alloying with the electrode wiring 151 does not occur.

A graph line L5 in FIG. 6 shows the measured ratio of the resistance change of the electrode structure 71 for the semiconductor device shown in FIG. 11 used in Description of The Related Art, in which the large change of the resistance value is read.

Incidentally, the present invention is not intended to be limited to the aforementioned embodiment, and the following modifications are included in the scope of the present invention.

In the aforementioned embodiment, the proportion of the number of titanium atoms, used for the first titanium nitride film 261A, is defined at 62% to 75%, the proportion of the number of titanium atoms, used for the second titanium nitride film 261B, is defined at 50% to 59%, and a long-term endurance in the high-temperature atmosphere of 300° C. is verified. But, it is possible that the composition ratios of the first titanium nitride film 261A and the second titanium nitride film 261B are appropriately defined considering the temperature conditions of an actual workplace, the required endurance, and so on.

Figure 7:
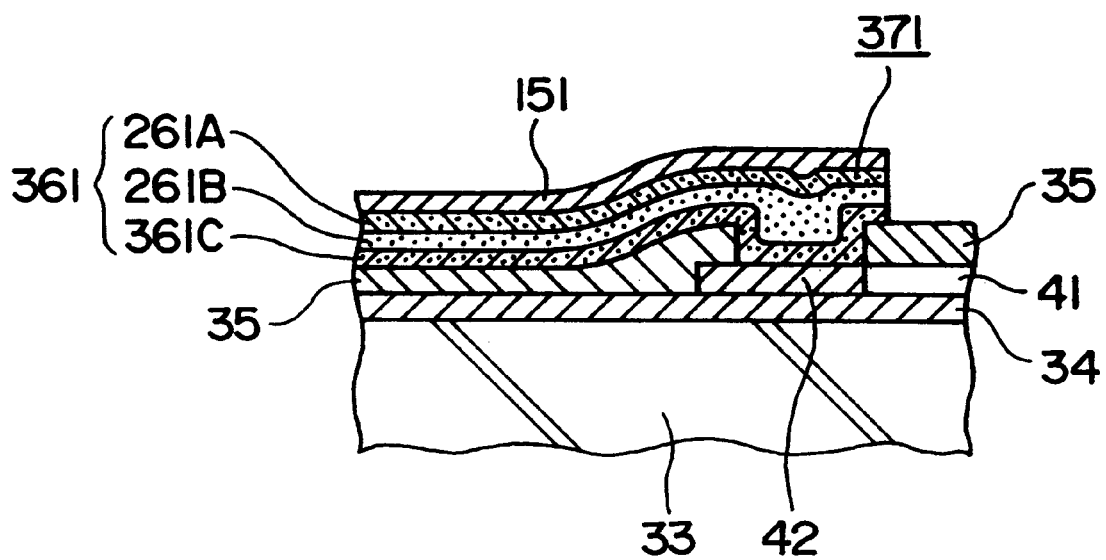
FIG. 7 is fragmentary sectional view of an electrode structure for a semiconductor device according to a modification of the aforementioned embodiment.
Figure 8:
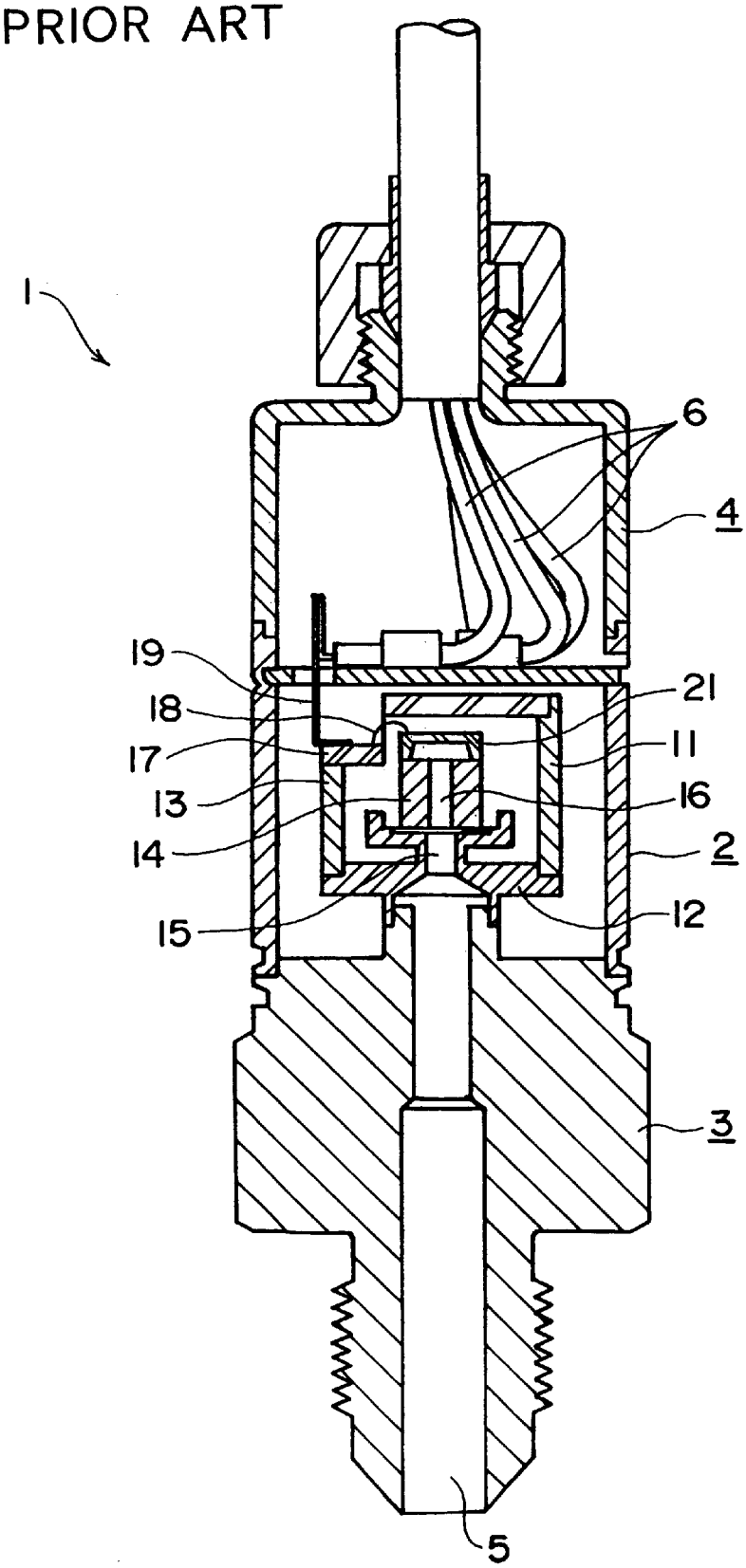
FIG. 8 is a sectional view showing a conventional pressure sensor provided therein with a pressure-sensor chip using an electrode structure for a semiconductor.
Figure 9:
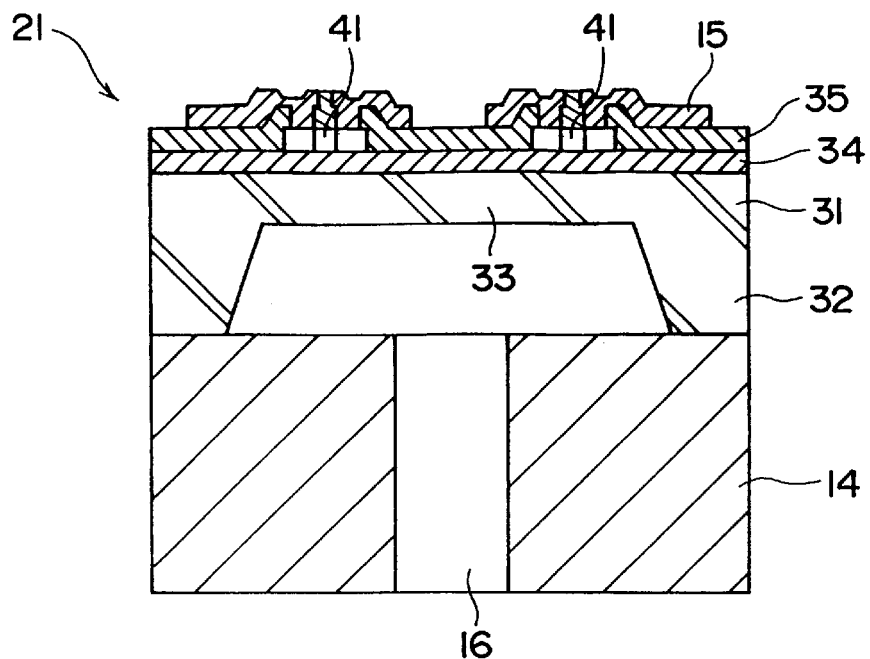
FIG. 9 is a sectional view of the conventional pressure-sensor chip.
Figure 10:
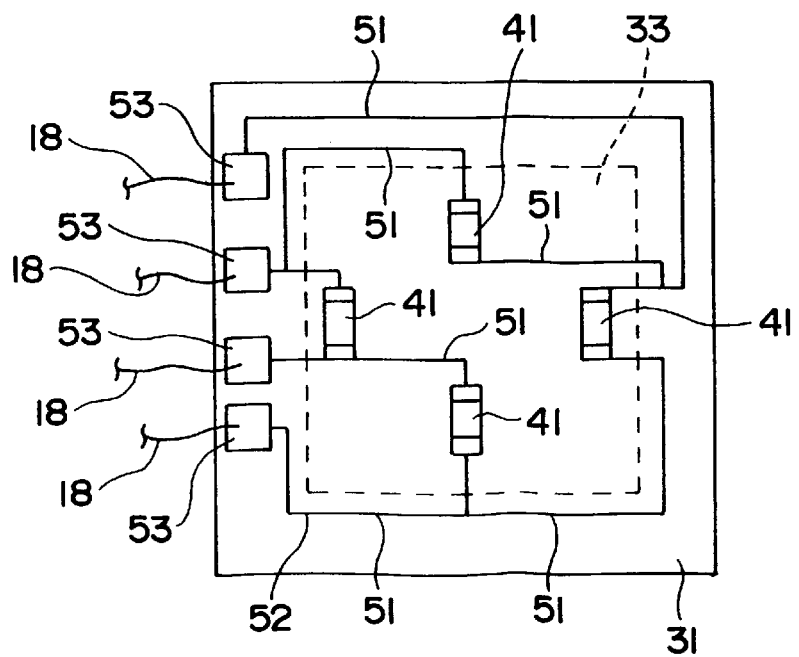
FIG. 10 is a schematic view showing an electrode wiring formed on the conventional pressure-sensor chip.

In the aforementioned embodiment, the electrode structure 271 for the semiconductor device has the barrier layer of a two-layer structure composed of the first titanium nitride film 261A and the second titanium nitride film 261B. But, as shown in FIG. 7, it is possible to form an electrode structure 371 for the semiconductor device having a barrier layer 361 of a three-layer structure composed of the first titanium nitride film 261A, the second titanium nitride film 261B formed beneath the first film 261A, and further, a third layer 361C, consisting of the titanium nitride or the titanium, formed between the second titanium nitride film 261B and the contact area 42.

Here, the third layer 361C is provided in order that an ohmic contact with the contact area 42 is further sufficient. Where the semiconductor device 41 is single crystal, it is advisable that the composition ratio of the third layer is rich in titanium, and the film thickness is approximately 500 Å to 1,000 Å in the same way as the first titanium nitride film 261A.

Further, in the aforementioned embodiment, the composition ratio of the titanium nitride in the barrier layer 261 is stageably changed. But the barrier layer may also be structured to continuously change the composition ratio of the titanium nitride within each stage in the thickness of the barrier layer.

In other words, insofar as functions of the barrier performance, the bond performance and so on which are required at each stage in the barrier layer are ensured in correspondence to each stage in the direction of the thickness of the barrier layer, the object of the present invention is achieved.

In the aforementioned embodiment, the high-melting metal nitride is the titanium nitride. But the barrier layer can be formed by using other metal nitrides. That is to say, insofar as the barrier layer in the present invention is the barrier layer superior in the bond performance with the electrode wiring and in which the semiconductor device is not alloyed by thermal diffusion even in the high-temperature atmosphere, the object of the present invention is achieved.

Further, in the aforementioned embodiment, the substrate temperature is defined at 300° C., when the first titanium nitride film and the second titanium nitride film are formed by means of the reactive sputtering. But, the substrate temperature is not limited to be defined at 300° C., and can be defined at the higher temperature within the range the diffusion between layers does not occur, for example, the substrate temperature may be defined in the range of 300° C. to 550° C.

In the aforementioned embodiment, the electrode structure and the wiring structure are formed by means of the magnetron sputtering. But the structures can be formed by using other sputtering methods such as ion beam sputtering and so on. In other words, the above method allows the reactive sputtering to be used for forming the barrier layer also.

And further, the pressure sensor chip 21 may be an SOS (Silicon On Sapphire) type sensor chip, in which the semiconductor device 41 is formed on the substrate using sapphire.

In addition, concrete structure, configuration and so on in embodying the present invention can be other structures and so on within the scope the object of the present invention is allowed to be achieved.

What is claimed is:

1. An electrode structure for a semiconductor device, which is formed on the semiconductor device, consisting of silicon formed on a substrate, and for detecting a physical quantity of the substrate and converting it into an electric signal, and transferring the electric signal to the outside, comprising:

a barrier layer consisting of a high-melting metal nitride and formed on a contact area of the semiconductor;

an electrode wiring formed on the barrier layer, the barrier layer having a multilayered structure laminated with films of said high-melting metal nitride, consisting of nitrides of the same metal each having a different composition ratio from one another, said barrier layer having therein a barrier performance which prevents the metal composing said electrode wiring from diffusing into the semiconductor device, and the composition ratio of said high-melting metal nitride forming said barrier layer, being defined to have a strong bonding force with a matter bonded with said barrier layer, in at least any one of a bonding border area between said barrier layer and said electrode wiring, and a bonding border area between said barrier layer and the contact area;

wherein said high-melting metal nitride is a titanium nitride;

wherein said barrier layer has a first titanium nitride film located to contact with said electrode wiring and a second titanium nitride film located under said first titanium nitride film, said first titanium nitride film having the composition ratio to have strong bonding force with said electrode wiring and said second titanium nitride film having the composition ratio, preventing a metal element composing said electrode wiring from diffusing into the contact area of the semiconductor device;

wherein the composition ratio of said first titanium nitride film has the proportion of the number of titanium atoms of a range from 62% to 75% for the titanium nitride; and wherein the composition ratio of said second titanium nitride film has the proportion of the number of titanium atoms of a range from 50% to 59% for the titanium nitride.

2. The electrode structure for the semiconductor device according to claim 1:

wherein said first titanium nitride film is 500 Å to 1,000 Å thick; and wherein said second titanium nitride film is of 3,000 Å to 4,000 Å thick.

3. An electrode structure for a semiconductor device, which is formed on the semiconductor device, consisting of silicon formed on a substrate, and for detecting a physical quantity of the substrate and converting it into an electric signal, and transferring the electric signal to the outside, comprising:

a barrier layer consisting of a high-melting metal nitride and formed on a contact area of the semiconductor;

an electrode wiring formed on the barrier layer, the barrier layer having a multilayered structure laminated with films of said high-melting metal nitride, consisting of nitrides of the same metal each having a different composition ratio from one another, said barrier layer having therein a barrier performance which prevents the metal composing said electrode wiring from diffusing into the semiconductor device, and the composition ratio of said high-melting metal nitride forming said barrier layer, being defined to have a strong bonding force with a matter bonded with said barrier layer, in at least any one of a bonding border area between said barrier layer and said electrode wiring, and a bonding border area between said barrier layer and the contact area;

wherein said high-melting metal nitride is a titanium nitride;

wherein said barrier layer has a first titanium nitride film located to contact with said electrode wiring and a second titanium nitride film located under said first titanium nitride film, said first titanium nitride film having the composition ratio to have strong bonding force with said electrode wiring and said second titanium nitride film having the composition ratio, preventing a metal element composing said electrode wiring from diffusing into the contact area of the semiconductor device; and wherein said first titanium nitride film is 500 angstroms to 1,000 angstroms thick; and wherein said second titanium nitride film is 3,000 angstroms to 4,000 angstroms thick.

* * * * *